United States Patent
Stern

(10) Patent No.: US 9,530,818 B2
(45) Date of Patent: Dec. 27, 2016

(54) IMAGE SENSOR INTEGRATED CIRCUIT PACKAGE WITH REDUCED THICKNESS

(71) Applicant: SEMICONDUCTOR COMPONENTS INDUSTRIES, LLC, Phoenix, AZ (US)

(72) Inventor: Jonathan Michael Stern, San Carlos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 12 days.

(21) Appl. No.: 14/470,863

(22) Filed: Aug. 27, 2014

(65) Prior Publication Data

US 2015/0064834 A1    Mar. 5, 2015

Related U.S. Application Data

(60) Provisional application No. 61/870,408, filed on Aug. 27, 2013.

(51) Int. Cl.
*H01L 27/146* (2006.01)
*H01L 23/00* (2006.01)

(52) U.S. Cl.
CPC ......... *H01L 27/14687* (2013.01); *H01L 24/81* (2013.01); *H01L 24/85* (2013.01); *H01L 27/14618* (2013.01); *H01L 27/14683* (2013.01); *H01L 2224/48091* (2013.01); *H01L 2224/73265* (2013.01); *H01L 2224/85* (2013.01); *H01L 2924/00014* (2013.01); *H01L 2924/014* (2013.01); *H01L 2924/12043* (2013.01)

(58) Field of Classification Search
None
See application file for complete search history.

(56) References Cited

U.S. PATENT DOCUMENTS

| 8,153,508 | B2 | 4/2012 | Kim |
| 8,748,202 | B2 | 6/2014 | Kwon et al. |
| 2006/0134835 | A1* | 6/2006 | He ...................... H01L 21/4857 438/124 |
| 2009/0284628 | A1* | 11/2009 | Wu ................... H01L 27/14618 348/294 |
| 2011/0080516 | A1* | 4/2011 | Yi et al. ........................ 348/374 |
| 2013/0009286 | A1* | 1/2013 | Kim et al. .................... 257/632 |
| 2013/0069241 | A1* | 3/2013 | Lin ......................... H01L 24/97 257/774 |
| 2013/0214423 | A1* | 8/2013 | Sadaka ................. H01L 21/486 257/774 |

* cited by examiner

*Primary Examiner* — Calvin Choi
*Assistant Examiner* — Xiaoming Liu
(74) *Attorney, Agent, or Firm* — Treyz Law Group, P.C.; Kendall W. Abbasi

(57) ABSTRACT

An image sensor die may include a pixel array formed in an image sensor substrate. The image sensor die may be mounted to a thin metal interconnect layer that has been deposited on a sacrificial carrier substrate. The thin metal interconnect layer may include one or more metal layers that are patterned to form metal traces that serve as contact pads, signal lines, and other interconnects in the interconnect layer. The image sensor die may be wire bonded, flip-chip mounted, or otherwise mechanically and electrically coupled to the metal interconnect layer. The sacrificial carrier substrate may be etched or otherwise removed to expose the metal interconnects on the metal interconnect layer. An array of solder balls may be formed on the exposed metal interconnects to form a ball grid array package, or the exposed contact pads may be plated to form a leadless chip carrier package.

20 Claims, 4 Drawing Sheets

IMAGE SENSOR INTEGRATED CIRCUIT PACKAGE WITH REDUCED THICKNESS

This application claims the benefit of provisional patent application No. 61/870,408, filed Aug. 27, 2013, which is hereby incorporated by reference herein in its entirety.

BACKGROUND

This relates generally to imaging systems and, more particularly, to image sensor integrated circuit packages having reduced thicknesses.

Modern electronic devices such as cellular telephones, cameras, and computers often use digital image sensors. Imagers (i.e., image sensors) often include a two-dimensional array of image sensing pixels. Each pixel typically includes a photosensitive element such as a photodiode that receives incident photons (light) and converts the photons into electrical signals.

In a typical arrangement, an image sensor integrated circuit package includes an image sensor die mounted to a printed circuit board. The image sensor die may, for example, include bond pads that are electrically coupled to bond pads on the printed circuit substrate using wire bonds.

The printed circuit board in a conventional image sensor integrated circuit package significantly contributes to the overall size of the package and can result in an excessively bulky package that is cumbersome to handle. The printed circuit board in the image sensor integrated circuit package is often mounted to a second printed circuit board in an electronic device, consuming valuable real estate in the electronic device.

It would therefore be desirable to provide improved ways of forming image sensor integrated circuit packages.

DETAILED DESCRIPTION

Electronic devices such as digital cameras, computers, cellular telephones, and other electronic devices include image sensors that gather incoming image light to capture an image. An image sensor may include an array of imaging pixels. The imaging pixels may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
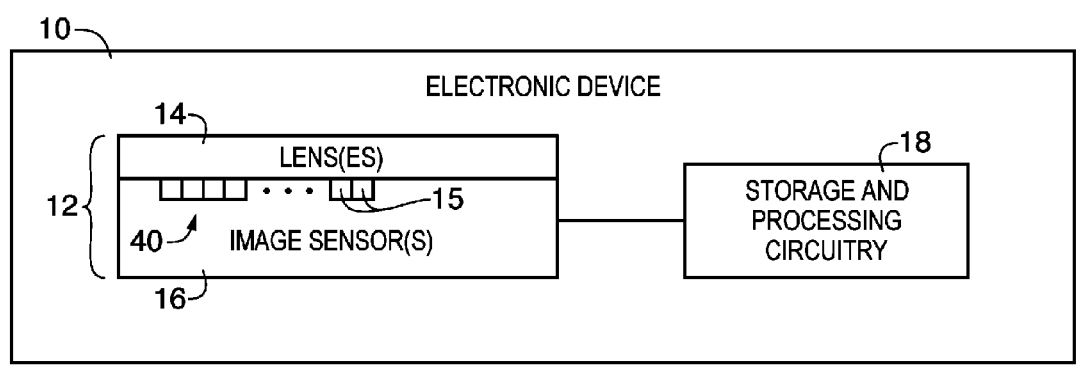
FIG. 1 is a diagram of an illustrative imaging system having a camera module that includes one or more image sensors in accordance with an embodiment of the present invention.

FIG. 1 is a diagram of an illustrative electronic device that uses one or more image sensors to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. If desired, camera module 12 may be provided with an array of lenses 14 and an array of corresponding image sensors 16. Each image sensor 16 may include an image pixel array 40 with an array of image sensor pixels 15. Image sensors 16 may include one or more backside illumination (BSI) image sensors and/or one or more front side illumination (FSI) image sensors.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2A:
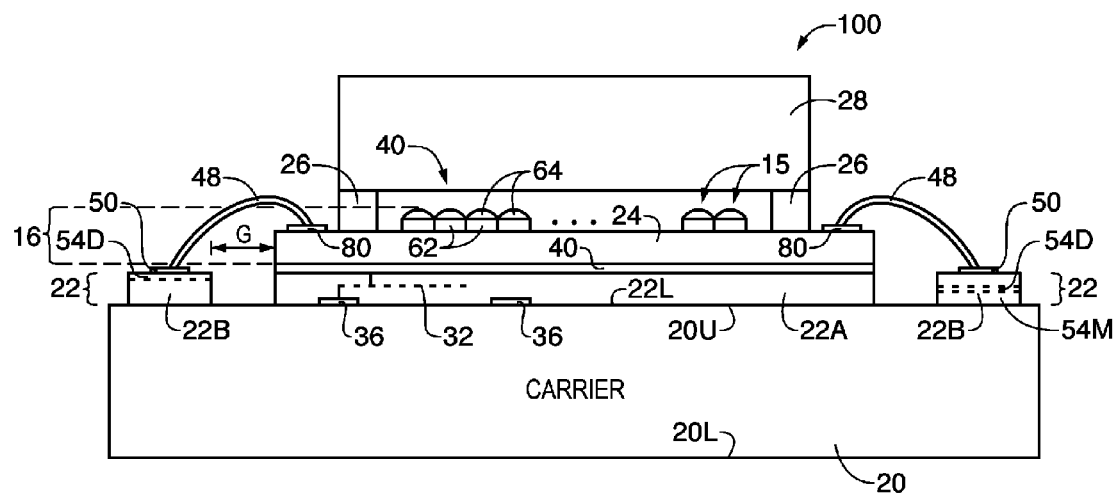
FIG. 2A is a cross-sectional side view of an illustrative image sensor die that is wire bonded to a metal interconnect layer on a carrier substrate in accordance with an embodiment of the present invention.

FIG. 2A shows an illustrative image sensor package 100 including an image sensor die such as image sensor integrated circuit die 16. Image sensor die 16 may include an image pixel array 40 having an array of image sensor pixels 15. Image pixel array 40 may include an array of photosensitive elements such as photodiodes formed in a substrate such as image sensor substrate 24. An array of color filter elements 62 may be formed over the array of photodiodes and an array of microlenses 64 may be formed over the array of color filter elements 62. Substrate 24 may include a semiconductor substrate (e.g., an epitaxial silicon layer) in which the photodiodes are formed and a dielectric layer (e.g., an oxide layer) in which metal interconnect circuitry is formed (sometimes referred to as an interlayer dielectric (ILD), an intermetal dielectric layer, an intermetal dielectric stack, or an interconnect stack).

Image sensor 16 may be a backside illumination image sensor or may be a front side illumination image sensor. In a front side illumination image sensor, circuitry such as metal interconnect circuitry may be interposed between the microlens array and the photosensitive regions of the image sensor. In a backside illumination image sensor, the photosensitive regions are interposed between the microlens array and the metal interconnect circuitry of the image sensor.

A protective cover layer such as transparent protective cover layer 28 may cover image sensor 16. Cover layer 28 may be formed from a transparent glass sheet, a clear plastic layer, or other suitable transparent member or partially transparent member. Cover layer 28 may be attached to image sensor substrate 24 using an adhesive such as adhesive 26. Adhesive 26 may, for example, be a photodefinable adhesive such as a dry film adhesive that can be applied and patterned using photolithographic techniques. Prior to attaching cover layer 28, adhesive 26 may be laminated or otherwise applied over image sensor 16 and then patterned to remove portions of the adhesive that cover pixel array 40. After forming adhesive 26, cover layer 28 may be attached to substrate 24 and adhesive 26 may be cured to bond cover layer 28 to substrate 24.

Image sensor die 16 may be mounted to an interconnect layer such as interconnect layer 22 formed on a carrier such as carrier substrate 20 (sometimes referred to as a sacrificial carrier substrate). Interconnect layer 22 may be formed by depositing and patterning metal thin-film layers on upper surface 20U of carrier substrate 20. Metal layers in interconnect layer 22 may be patterned to form metal traces that serve as contact pads, signal lines, and other interconnects in layer 22. For example, as shown in FIG. 2A, interconnect layer 22 may include metal interconnect structures such as traces 32, bond pads 36, and bond pads 50. Interconnect layer 22 may be deposited by electroplating, chemical vapor deposition, physical vapor deposition, sputtering, or other suitable deposition techniques. Illustrative materials that may be used in forming metal interconnect layer 22 include copper, nickel, gold, silver, other suitable metals, or a combination of any two or more of these materials.

If desired, interconnect layer 22 may include multiple layers of conductor interposed between insulating layers of dielectric. For example, interconnect layer 22 may optionally include one or more dielectric layers 54D and one or more metal layers 54M. This is, however, merely illustrative. If desired, interconnect layer 22 may be formed exclusively from metal layers.

Image sensor die 16 may be mounted to central portion 22A of metal interconnect layer 22 using an adhesive such as adhesive layer 40 (e.g., an electrically conductive die-attach adhesive or other suitable adhesive). Electrical signals may be conveyed between image sensor die 16 and metal interconnect layer 22 using any suitable integrated circuit packaging technique. In the example of FIG. 2A, image sensor die 16 is electrically coupled to bond pads 50 on peripheral portions 22B of metal interconnect layer 22 using wire bonds 48. In this way, data and control signals may be conveyed between image sensor die 16 and interconnect layer 22 via bond pad 80, wire bond 48, and bond pad 50. Peripheral portions 22B of metal interconnect layer 22 may be separated from central portion 22A by a gap G (as shown in the example of FIG. 2A) or may, if desired, be contiguous with central portion 22A.

To reduce the thickness of image sensor integrated circuit package 100, carrier substrate 20 on which metal interconnect layer 22 is formed may be removed after mounting and electrically connecting image sensor integrated circuit die 16 to metal interconnect layer 22. For example, carrier substrate 20 may be formed from a selectively removable material that can be etched or otherwise selectively removed to expose lower surface 22L of metal interconnect layer 22 (e.g., to expose bond pads 36 or other electrical contacts on lower surface 22L of interconnect layer 22). Illustrative materials that may be used to form carrier substrate 20 include aluminum or other suitable metals, silicon or other suitable semiconductors, silicon dioxide, photodefinable polymers, other suitable materials, or a combination of any two or more of these materials. Carrier 20 may, for example, be formed from a material such as aluminum that can be selectively etched without affecting metal layers of interconnect layer 22. Carrier 20 may be selectively removed by chemically etching away portions of carrier 20 that are not protected by a mask. If desired, the entirety of carrier 20 may be removed or there may be portions of carrier 20 that remain with package 100 after etching.

Figure 2B:
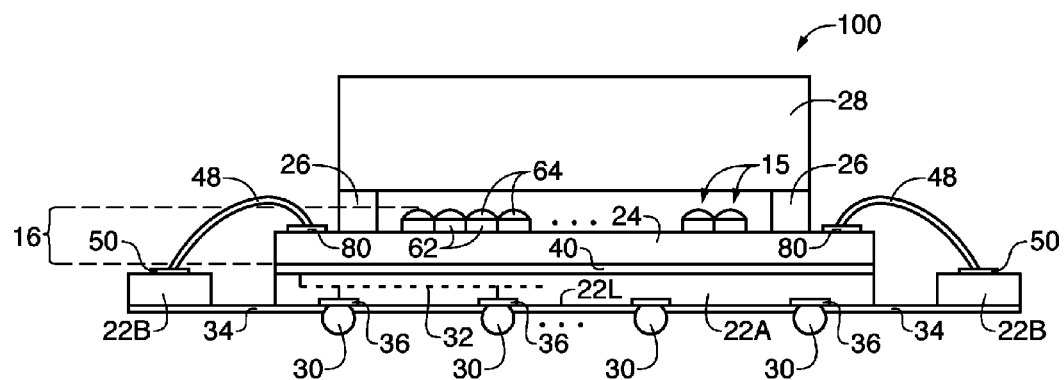
FIG. 2B is a cross-sectional side view of the image sensor die of FIG. 2A following selective removal of the carrier substrate in accordance with an embodiment of the present invention.

FIG. 2B is a cross-sectional side view of image sensor integrated circuit package 100 of FIG. 2A after carrier substrate 20 has been removed. Removing carrier substrate 20 exposes metal interconnects in interconnect layer 22 such as metal bond pads 36 on lower surface 22L of interconnect layer 22. Bond pads 36 may be used in surface mounting image sensor integrated circuit package 100. For example, a ball grid array (BGA) or micro-BGA may be formed by attaching an array of solder balls 30 to contact pads 36 of interconnect layer 22.

Before attaching solder balls 30 to bond pads 36, an under bump metallization (UBM) layer may be deposited onto lower surface 22L of interconnect layer 22. A solder mask may then be applied and solder balls 30 may be attached to bond pads 36. If desired, an insulating layer such as organic insulating layer 34 may be applied to lower surface 22L of interconnect layer 22 before attaching solder balls 30. Insulating layer 34 may be provided with openings that align with bond pads 36 on interconnect layer 22.

The example of FIGS. 2A and 2B in which image sensor integrated circuit die 16 is electrically coupled to interconnect layer 22 via wire bonds 48 is merely illustrative. If desired, image sensor integrated circuit die 16 may be flip-chip mounted to interconnect layer 22. This type of arrangement is illustrated in FIG. 3A.

Figure 3A:
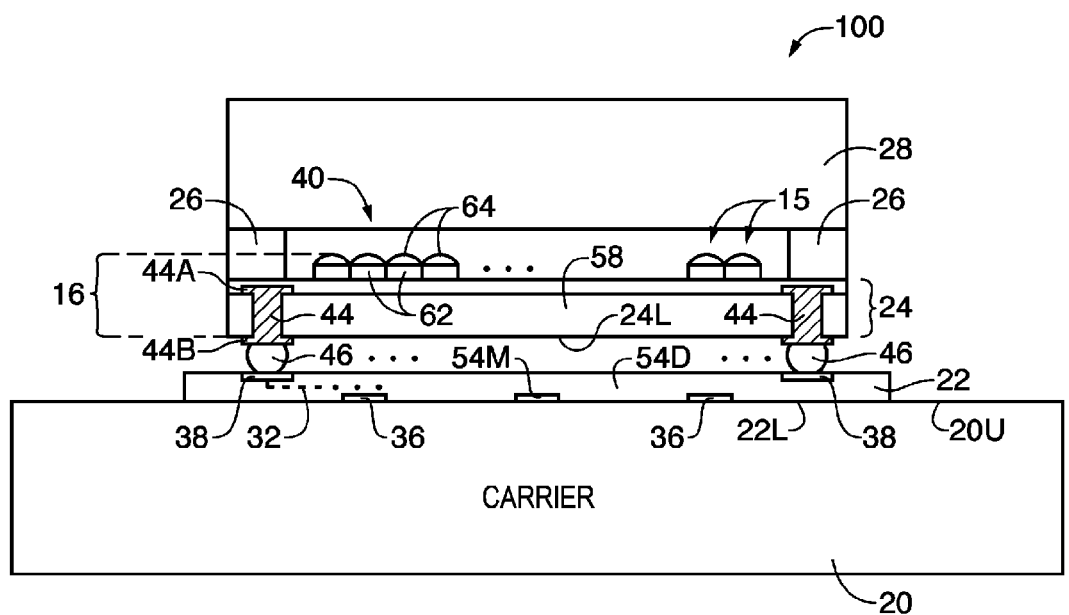
FIG. 3A is a cross-sectional side view of an illustrative image sensor die that is flip-chip mounted to a metal interconnect layer on a carrier substrate in accordance with an embodiment of the present invention

FIG. 3A shows an illustrative image sensor package 100 including an image sensor die such as image sensor integrated circuit die 16. Image sensor die 16 may include an image pixel array 40 having an array of image sensor pixels 15. Image pixel array 40 may include an array of photosensitive elements such as photodiodes formed in a substrate such as image sensor substrate 24. An array of color filter elements 62 may be formed over the array of photodiodes and an array of microlenses 64 may be formed over the array of color filter elements 62. Substrate 24 may include a semiconductor substrate (e.g., an epitaxial silicon layer) in which the photodiodes are formed and a dielectric layer (e.g., an oxide layer) in which metal interconnect circuitry is formed (sometimes referred to as an interlayer dielectric (ILD), an intermetal dielectric layer, an intermetal dielectric stack, or an interconnect stack).

A protective cover layer such as transparent protective cover layer 28 may cover image sensor 16. Cover layer 20 may be formed from a transparent glass sheet, a clear plastic layer, or other suitable transparent member or partially transparent member. Cover layer 28 may be attached to image sensor substrate 24 using an adhesive such as adhesive 26. Adhesive 26 may, for example, be a photodefinable adhesive such as a dry film adhesive that can be applied and patterned using photolithographic techniques. Prior to attaching cover layer 28, adhesive 26 may be laminated or otherwise applied over image sensor 16 and then patterned to remove portions of the adhesive that cover pixel array 40. After forming adhesive 26, cover layer 28 may be attached to substrate 24 and adhesive 26 may be cured to bond cover layer 28 to substrate 24.

Image sensor die 16 may be mounted to an interconnect layer such as interconnect layer 22 formed on a carrier such as carrier substrate 20. Interconnect layer 22 may be formed by depositing and patterning metal thin-film layers on upper surface 20U of carrier substrate 20. Metal layers in interconnect layer 22 may be patterned to form metal traces that serve as contact pads, signal lines, and other interconnects in layer 22. For example, as shown in FIG. 3A, interconnect layer 22 may include metal interconnect structures such as traces 32, bond pads 36, and bond pads 38. Interconnect layer 22 may be deposited by electroplating, chemical vapor deposition, physical vapor deposition, sputtering, or other suitable deposition techniques. Illustrative materials that may be used in forming metal interconnect layer 22 include copper, nickel, gold, silver, other suitable metals, or a combination of any two or more of these materials.

If desired, interconnect layer 22 may include multiple layers of conductor interposed between insulating layers of dielectric. For example, interconnect layer 22 may optionally include one or more dielectric layers 54D and one or more metal layers 54M. This is, however, merely illustrative. If desired, interconnect layer 22 may be formed exclusively from metal layers.

Substrate 24 of image sensor die 16 may include a bulk silicon layer such as bulk silicon layer 58. Conductive interconnect structures such as conductive vias 44 may be formed in bulk silicon layer 58 and may be used in coupling image sensor circuitry associated with image pixel array 40 to contacts on rear surface 24L of die 16. For example, as shown in FIG. 3A, one end of conductive via 44 may be coupled to contact pad 44A on the upper surface of layer 58, while an opposing end of conductive via 44 may be coupled to contact pad 44B on lower surface 24L of image sensor die 16.

Bond pads 44A and 44B may be formed from aluminum, copper, silver, gold, a combination of these materials, or other suitable conductive materials. If desired, via structure 44 may be formed using the same material that is used to form bond pad 44A and/or bond pad 44B, or via structure 44 and bond pads 44A and 44B may be formed from different materials. The example of FIG. 3A in which via structure 44 is formed by a conductive material that completely fills an opening in layer 58 is merely illustrative. If desired, via structure 44 may be formed by a conductive material that only lines an opening in layer 58.

In the example of FIG. 3A, image sensor die 16 is mounted to interconnect layer 22 using solder such as solder balls 46. Solder balls 46 form a conductive signal path between bond pad 44B of image sensor die 16 and bond pad 38 of interconnect layer 22. In this way, data and control signals may be conveyed between image sensor die 16 and interconnect layer 22 via bond pad 44A, via 44, bond pad 44B, solder ball 46, and bond pad 38.

To reduce the thickness of image sensor integrated circuit package 100, carrier substrate 20 on which metal interconnect layer 22 is formed may be removed after mounting and electrically connecting image sensor integrated circuit die 16 to metal interconnect layer 22. For example, carrier substrate 20 may be formed from a selectively removable material that can be etched or otherwise selectively removed to expose lower surface 22L of metal interconnect layer 22 (e.g., to expose bond pads 36 or other electrical contacts on lower surface 22L of interconnect layer 22). Illustrative materials that may be used to form carrier substrate 20 include aluminum or other suitable metals, silicon or other suitable semiconductors, silicon dioxide, photodefinable polymers, other suitable materials, or a combination of any two or more of these materials. Carrier 20 may, for example, be formed from a material such as aluminum that can be selectively etched without affecting metal layers of interconnect layer 22. Carrier 20 may be selectively removed by chemically etching away portions of carrier 20 that are not protected by a mask. If desired, the entirety of carrier 20 may be removed or there may be portions of carrier 20 that remain with package 100 after etching.

Figure 3B:
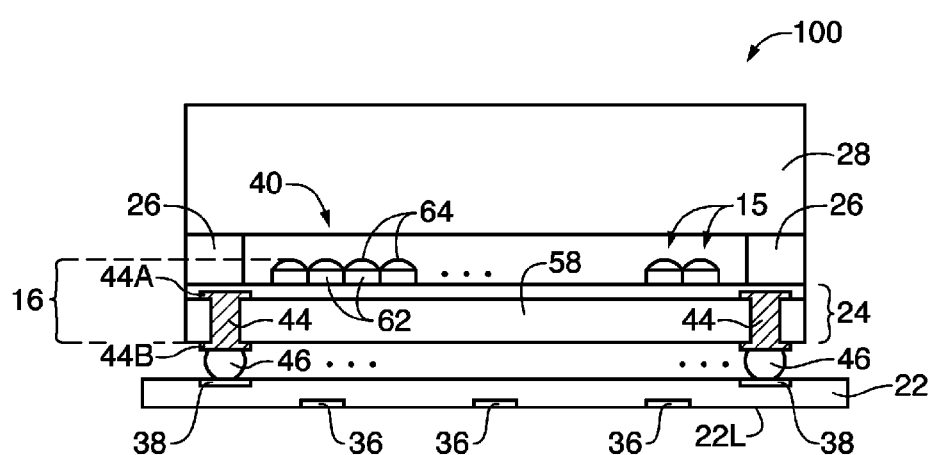
FIG. 3B is a cross-section side view of the image sensor die of FIG. 3A following selective removal of the carrier substrate in accordance with an embodiment of the present invention.

FIG. 3B is a cross-sectional side view of image sensor integrated circuit package 100 of FIG. 3A after carrier substrate 20 has been removed. Removing carrier substrate 20 exposes metal interconnects in interconnect layer 22 such as metal bond pads 36 on lower surface 22L of interconnect layer 22. Bond pads 36 may be used in surface mounting image sensor integrated circuit package 100. For example, exposed metal on interconnect layer 22 such as exposed bond pads 36 may be surface plated (e.g., using an electroless nickel immersion gold plating or other suitable surface plating) to create a leadless carrier chip package.

Figure 4:
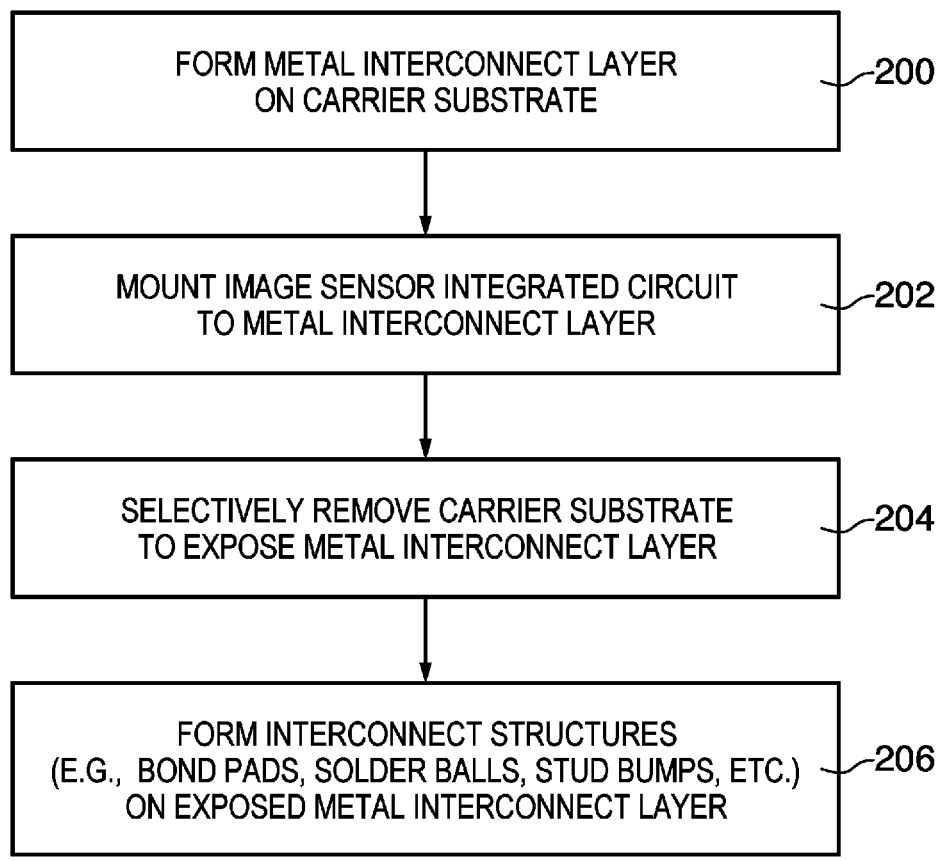
FIG. 4 is a flow chart of illustrative steps involved in forming an image sensor integrated circuit package with reduced thickness in accordance with an embodiment of the present invention.

FIG. 4 is a flow chart of illustrative steps involved in forming a reduced-thickness image sensor integrated circuit package of the type shown in FIGS. 2B and 3B.

At step 200, an interconnect layer such as interconnect layer 22 of FIGS. 2A and 3A may be formed on a carrier substrate such as carrier substrate 20. This may include, for example, depositing and patterning one or more layers of conductor and one or more layers of dielectric on the surface of carrier substrate 20. Patterned metal layers in interconnect layer 22 may be used in forming metal traces that serve as contact pads, signal lines, and other interconnects in layer 22. If desired, the interconnect layer may be formed exclusively from metal and may not include any dielectric layers.

At step 202, an integrated circuit die such as image sensor integrated circuit die 16 may be mounted and electrically coupled to metal interconnect layer 22 on carrier substrate 20. This may include, for example, mechanically attaching image sensor die 16 to interconnect layer 22 using an adhesive and electrically coupling image sensor die 16 to interconnect layer 22 using wire bonds. In other embodiments, image sensor die 16 may be flip-chip bonded to interconnect layer 22 and may include rear surface contacts that are electrically connected to surface contacts on interconnect layer 22 using conductive material such as solder. If desired, additional processing steps may be performed while image sensor die 16 is supported by carrier 20. For example, a cover layer such as cover layer 28 may be attached to image sensor die 16 after attaching image sensor die 16 to interconnect layer 22, if desired. Encapsulation steps may also be performed after attaching image sensor die 16 to interconnect layer 22 (e.g., to encapsulate the edges of the cover layer, the periphery of the image sensor die, the bond wires that couple image sensor die 16 to interconnect layer 22, etc.).

At step 204, portions of carrier substrate 20 may be removed to expose metal interconnects on interconnect layer 22. This may include, for example, chemically or photolithographically etching away portions of carrier substrate 20 to expose bond pads or copper traces on interconnect layer 22. If desired, the entirety of carrier 20 may be removed during step 204 or there may be portions of carrier 20 that remain on interconnect layer 22 after etching.

At step 206, interconnect structures may be formed on the exposed metal on interconnect layer 22. This may include, for example, forming a ball grid array (BGA) or micro-BGA by attaching an array of solder balls to the exposed contact pads on interconnect layer 22. Before attaching the solder balls, an under bump metallization (UBM) layer may be deposited onto the lower surface of interconnect layer 22. A solder mask may then be applied and the solder balls may be attached to the contact pads. If desired, an organic insulating layer with openings aligned with the contact pads may be applied to the lower surface of interconnect layer 22 before attaching solder balls.

In other embodiments, step 206 may include surface plating (e.g., using an electroless nickel immersion gold plating or other suitable surface plating) the exposed contact pads on interconnect layer 22 to create a leadless carrier chip package.

Various embodiments have been described illustrating an electronic device that includes an imaging system. The imaging system may include one or more image sensors. An image sensor die may include a pixel array formed in an image sensor substrate and covered by a transparent cover layer (sometimes referred to as a glass lid). The transparent cover layer may be attached to the image sensor substrate using an adhesive. The image sensor die may be packaged to form an image sensor integrated circuit package.

The image sensor die may be mounted to a thin metal interconnect layer that has been deposited on a sacrificial carrier substrate. The thin metal interconnect layer may include one or more metal layers that are patterned to form metal traces that serve as contact pads, signal lines, and other interconnects in the interconnect layer. The image sensor die may be wire bonded, flip-chip mounted, or otherwise mechanically and electrically coupled to the metal interconnect layer. The carrier substrate may be formed from aluminum, silicon, or other suitable materials. The metal interconnect layer may be formed exclusively from metal or may include alternating layers of conductor and dielectric.

If desired, additional processing steps may be performed after mounting the image sensor die to the metal interconnect layer on the carrier substrate. For example, the transparent cover may be adhered to the image sensor substrate after the image sensor substrate is mounted to and supported by the carrier substrate.

The carrier may then be selectively removed to expose metal interconnects on the metal interconnect layer. If desired, the entirety of the carrier substrate may be removed by etching or there may be portions of the carrier substrate that remain on interconnect layer after etching. The exposed metal interconnects may then be plated or otherwise prepared for surface mounting. For example, an array of solder balls may be coupled to the exposed contact pads on the metal interconnect layer to form a ball grid array package, or the exposed contact pads may be plated to form a leadless chip carrier package.

The foregoing is merely illustrative of the principles of this invention and various modifications can be made by those skilled in the art. The foregoing embodiments may be implemented individually or in any combination.

What is claimed is:

1. A method for forming an image sensor integrated circuit package, comprising:
   depositing an interconnect layer having first and second opposing surfaces onto a carrier substrate,
   wherein the interconnect layer comprises a first contact pad on the first surface and a second contact pad on the second surface,
   wherein depositing the interconnect layer comprises depositing metal directly onto the carrier substrate to form the second contact pad, and wherein the interconnect layer comprises a peripheral portion that is separated from a central portion by a gap;
   attaching an image sensor integrated circuit die to the first contact pad on the first surface of the interconnect layer; and
   etching the carrier substrate to completely remove the carrier substrate and thereby expose the second contact pad on the second surface of the interconnect layer.

2. The method defined in claim 1 wherein the carrier substrate comprises aluminum.

3. The method defined in claim 1 wherein the carrier substrate comprises silicon.

4. The method defined in claim 1 wherein attaching the image sensor integrated circuit die to the first contact pad comprises forming a wire bond between a third contact pad on the image sensor integrated circuit die and the first contact pad on the first surface of the interconnect layer.

5. The method defined in claim 1 wherein attaching the image sensor integrated circuit die to the first contact pad comprises electrically connecting a third contact pad on a rear surface of the image sensor integrated circuit die to the first contact pad on the first surface of the interconnect layer using solder.

6. The method defined in claim 5 wherein the image sensor integrated circuit die comprises a conductive via that passes through a portion of the image sensor integrated circuit die and is coupled to the third contact pad on the rear surface of the image sensor integrated circuit die.

7. The method defined in claim 1 wherein etching the carrier substrate to remove the carrier substrate comprises removing the entirety of the carrier substrate.

8. The method defined in claim 1 wherein the second contact pad is one of a plurality of contact pads on the second surface of the interconnect layer and wherein etching the carrier substrate to remove the carrier substrate comprises exposing the plurality of contact pads on the second surface of the interconnect layer.

9. The method defined in claim 8, further comprising:
   plating the exposed plurality of contact pads on the second surface of the interconnect layer to form a leadless chip carrier package.

10. The method defined in claim 8, further comprising:
    attaching a plurality of solder balls to the plurality of exposed contact pads on the second surface of the interconnect layer to form a ball grid array package.

11. The method defined in claim 10, further comprising:
    prior to attaching the plurality of solder balls, applying an organic insulating layer over the second surface of the interconnect layer, wherein the organic insulating layer has a plurality of openings and wherein each of the openings aligns with a respective one of the exposed contact pads on the second surface of the interconnect layer.

12. The method defined in claim 1 wherein the interconnect layer comprises at least one dielectric layer.

13. A method for forming an image sensor integrated circuit package, comprising:
    depositing and patterning an interconnect layer that comprises at least one metal thin-film layer on a carrier substrate,
    wherein the interconnect layer has opposing first and second surfaces,
    wherein depositing and patterning the interconnect layer comprises depositing metal directly onto the carrier substrate to form the at least one metal thin-film layer, and
    wherein the interconnect layer comprises a peripheral portion that is separated from a central portion by a gap;

attaching an image sensor integrated circuit die to the first surface of the interconnect layer; and after attaching the image sensor integrated circuit die to the first surface of the interconnect layer, etching the carrier substrate to completely remove the carrier substrate and to expose a surface of the at least one metal thin-film layer.

14. The method defined in claim 13 wherein the carrier substrate comprises aluminum.

15. The method defined in claim 13 wherein attaching the image sensor integrated circuit die to the first surface comprises forming a wire bond between the image sensor integrated circuit die and the first surface of the interconnect layer.

16. The method defined in claim 13 wherein attaching the image sensor integrated circuit die to the first surface comprises flip-chip mounting the image sensor integrated circuit die to the first surface of the interconnect layer.

17. A method for forming an image sensor integrated circuit package, comprising:

mounting an image sensor integrated circuit die to an interconnect layer comprising at least one metal layer on an aluminum carrier substrate, wherein the interconnect layer comprises a plurality of metal contacts that are formed by depositing metal directly onto the aluminum carrier substrate and wherein the interconnect layer comprises a peripheral portion that is separated from a central portion by a gap;

after mounting the image sensor integrated circuit die to the interconnect layer on the aluminum carrier substrate, attaching a cover layer to the image sensor integrated circuit die; and after attaching the cover layer to the image sensor integrated circuit die, etching the aluminum carrier substrate to completely remove the aluminum carrier substrate and to expose the plurality of contacts of the interconnect layer.

18. The method defined in claim 17 wherein the cover layer comprises a transparent layer of glass.

19. The method defined in claim 17 wherein mounting the image sensor integrated circuit die to the interconnect layer on the aluminum carrier substrate comprises forming wire bonds between the image sensor integrated circuit die and the interconnect layer before etching the aluminum carrier substrate.

20. The method defined in claim 17 wherein mounting the image sensor integrated circuit die to the interconnect layer on the aluminum carrier substrate comprises electrically connecting a conductive via in the image sensor integrated circuit die to the interconnect layer using solder before etching the aluminum carrier substrate.

* * * * *